United States Patent
Maghsoudnia

(10) Patent No.: US 6,365,482 B1
(45) Date of Patent: Apr. 2, 2002

(54) I.C. THIN FILM RESISTOR STABILIZATION METHOD

(75) Inventor: Mozafar Maghsoudnia, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/429,701

(22) Filed: Oct. 28, 1999

(51) Int. Cl.[7] ............................................. H01L 21/20
(52) U.S. Cl. ........................ 438/384; 438/381; 438/382; 438/385
(58) Field of Search ................................. 438/381, 382, 438/384, 385, 238

(56) References Cited

U.S. PATENT DOCUMENTS 6,171,922 B1 * 1/2001 Maghsoudnia ............. 438/385
6,211,032 B1 * 5/2001 Redford et al. ............. 438/384

OTHER PUBLICATIONS

Grebene, "Thin–Film Processes", *Bipolar and MOS Analog Integrated Circuit Design*, John Wiley & Sons, Inc., pp. 22–26, (1984).

Hamilton et al, "Photolithography", *Basic Integrated Circuit Engineering*, McGraw–Hill Book Company, pp. 8–12, (1975).

Sze, "Rapid Thermal Annealing", *VLSI Technology*, Second Edition, McGraw–Hill Book Company, pp. 359–362, (1988).

* cited by examiner

Primary Examiner—John F. Niebling
Assistant Examiner—Jennifer M. Kennedy
(74) Attorney, Agent, or Firm—Koppel & Jacobs

(57) ABSTRACT

A method for stabilizing thin film structures fabricated on an I.C. wafer requires the performance of a rapid thermal annealing (RTA) step after the thin film material, preferably silicon-chromium (SiCr) or silicon chromium carbide (SiCrC), is sputtered onto the wafer. The RTA step stabilizes the TF and thereby increases the film's integrity. With the TF structures stabilized, the effect of subsequent high temperature process steps on the film is reduced. The stabilization method enables TF resistors thereby formed to attain a higher degree of accuracy, and thus to improve the ability with which resistors can be matched. Resistor TCR and sheet rho consistency are also improved, both within a given wafer and from wafer to wafer.

12 Claims, 4 Drawing Sheets

I.C. THIN FILM RESISTOR STABILIZATION METHOD

BACKGROUND OF THE INVENTION

1. Field of the Invention

This invention relates to the field of integrated circuit (I.C.) fabrication methods, and particularly to fabrication processes that include the formation of thin film resistors.

2. Description of the Related Art

"Thin film" processing is used to create structures or features on an integrated circuit wafer from a thin layer of material that has been deposited on top of an oxide layer formed on a substrate. Resistors, for example, are commonly fabricated using thin film techniques.

Present thin film processing methods, discussed, for example, in A. Grebene, *Bipolar and MOS Analog Circuit Design*, John Wiley & Sons (1984) pp. 22–26, possess several inherent characteristics that can adversely affect the performance of the resistors they are used to create. Thin film resistors, particularly those made from silicon chromium carbide (SiCrC), are fabricated per the following "back-end" process steps, i.e., steps performed after an I.C.'s active devices have been formed:

1. Contact Mask. With an oxide layer formed atop a silicon substrate, a contact mask step opens holes in the oxide where metal is to make contact to the silicon, for connection to the diffused terminals of a transistor, for example.
2. Sputter Platinum/sinter/strip. This step forms platinum silicide ($PtSi_2$) wells at the bottom of the contact openings made in step 1. First, platinum is sputtered on the wafers. Next, a sinter is performed in which the platinum is annealed at about 500° C. for about 30 minutes in dry nitrogen ($N_2$). During anneal, the platinum reacts with the silicon substrate and forms the $PtSi_2$ wells. After anneal, unreacted platinum is stripped, typically with a solution containing hydrochloric acid (HCl) and nitric acid ($HNO_3$).
3. Sputter Thin Film (TF). Here, the actual resistor material, typically SiCrC, is sputtered on the wafer.
4. Sputter Titanium Tungsten (TiW) and Aluminum Copper (AlCu). TiW is sputtered first, to provide a thin (~900 Å) barrier layer under the metal which helps with electromigration and current density, as well as improving the contacts to the TF resistor material. AlCu is then sputtered (at about 400° C.) on top of the TiW; it is the primary metal and carries the resistor current.
5. Metal 1 (M1) Mask. This step dry etches AlCu, TiW and SiCrC according to the M1 mask pattern to define the chip's metal traces and the boundaries of the TF resistors.
6. Thin Film Open Mask (TFOP). AlCu and TiW over the resistors are wet etched with hot phosphoric acid and hydrogen peroxide, respectively. This step removes material all the way down to the resistors' surface.
7. Plasma Enhanced Chemical Vapor Deposition (PECVD) Oxide Deposition I. A phosphorous-doped PECVD oxide is used between the M1 and Metal 2 (M2) layers. Performed at about 400° C.
8. Spin-On Glass (SOG) Coat/Cure and Etch Back. An inorganic material is spun onto the substrate to planarize the PECVD oxide, and then treated at 400–450° C. to form inorganic oxide. The wafer is plasma etched with a 1:1 ratio to smooth the edges of the PECVD oxide covering the M1 layer.
9. PECVD Oxide Deposition II. A second layer of PECVD oxide is deposited (at about 400° C.) to thicken the interlayer dielectric provided by the PECVD Oxide Deposition I and the SOG coat/cure steps.
10. Via Mask. A via mask step opens holes in the interlayer dielectric to enable contact to the M1 layer.
11. Sputter AlCu. This step, performed at about 400° C., creates the M2 layer.
12. Metal 2 Mask. This step dry etches the AlCu according to the M2 mask pattern.
13. Oxide/Oxynitride PECVD. Passivation is performed (at about 400° C.) using 2 layers: an undoped PECVD oxide layer followed by an oxynitride layer.
14. Seal Mask Oxynitride-oxide etch. The passivation layer is plasma etched in accordance with a seal mask to open holes to the M2 bond pads.
15. Alloy. This step sinters and stabilizes the TF material; it is typically necessary to perform the alloying at a temperature of about 465° C. to stabilize the TF.

Unfortunately, the TF resistors fabricated with this process are adversely impacted by the high temperature process steps (e.g., AlCu sputter, SOG Coat/Cure, Alloy) which occur after the TF sputter step. Each high temperature step (>~375° C.) alters the TF characteristics. Since the thermal heat from a particular step is non-uniform and has a gradient, its effect on the TF material is also non-uniform. This results in sheet rho and thermal coefficient of resistivity (TCR) parameters which vary from one spot to another on an individual wafer, as well as from wafer to wafer. These adverse effects impact the accuracy of the resistance values, as well as how well the resistors can be matched. Furthermore, as the resistors are subjected to additional high temperature process steps, the magnitude of the variations increases.

SUMMARY OF THE INVENTION

A novel method for the stabilization of thin film structures fabricated on an I.C. substrate is presented, which avoids the problems noted above.

The stabilization method requires the performance of a rapid thermal annealing (RTA) step after the TF material, preferably silicon-chromium (SiCr) or silicon chromium carbide (SiCrC), is sputtered onto the wafer. The RTA step stabilizes the TF and thereby increases the integrity of the film. With the TF material stabilized, the effect of subsequent high temperature process steps on the film, and thus on structures formed with the TF, is reduced.

The novel stabilization method enables TF resistors thereby formed to attain a higher degree of accuracy, and thus to improve the ability with which such resistors can be matched. The consistency of resistor TCR and sheet rho is also improved, both within a given wafer, and from wafer to wafer. In addition, because the TF material is already stabilized via the RTA step, the temperature of the alloy process step (which was responsible for stabilizing the TF in the prior art process) can be reduced, which can improve device reliability.

Further features and advantages of the invention will be apparent to those skilled in the art from the following detailed description, taken together with the accompanying drawings.

BRIEF DESCRIPTION OF THE DRAWINGS

FIGS. 1a–7a are top plan views illustrating the method of forming thin film structures on an I.C. wafer per the present invention.

FIGS. 1b–7b are cross-sectional views corresponding to the plan views in FIGS. 1a–7a, respectively, cut along section lines 1b—1b to 7b—7b, respectively.

DETAILED DESCRIPTION OF THE INVENTION

A new method of stabilizing thin film (TF) structures which provides improved accuracy, resistor matching capability, and device reliability, requires that a rapid thermal annealing (RTA) step be performed immediately after the thin film material is sputtered onto the wafer. This step anneals and stabilizes the TF material, enabling it to withstand subsequent high temperature process steps without having its characteristics, such as resistance, sheet rho, and TCR, unduly affected.

The invention is not limited to any particular thin film structure process sequence. An exemplary process sequence which forms TF structures per the present invention is shown in the series of plan views depicted in FIGS. 1a–7a, and their respective corresponding cross-sectional views in FIGS. 1b–7b.

Thin film structures are typically formed atop an oxide layer that is formed on an I.C. wafer's substrate. Silicon (Si) is the most commonly used substrate material, with TF structures typically formed on a silicon dioxide ($SiO_2$) layer. The discussion that follows presumes the use of an Si substrate and $SiO_2$ oxide layer, though, as discussed in more detail below, the method is not limited to use with these materials.

Figure 1A:
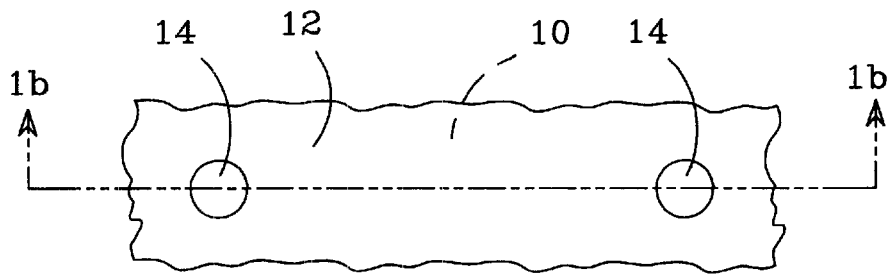
Figure 1B:
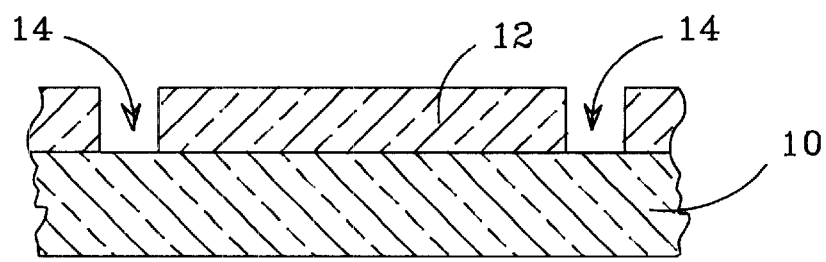

In FIGS. 1a and 1b, a substrate 10 is covered with an oxide layer 12. A contact masking step is performed to open up contact areas 14 through oxide layer 12 to substrate 10, to enable connection to already-fabricated devices such as transistors.

Figure 2A:
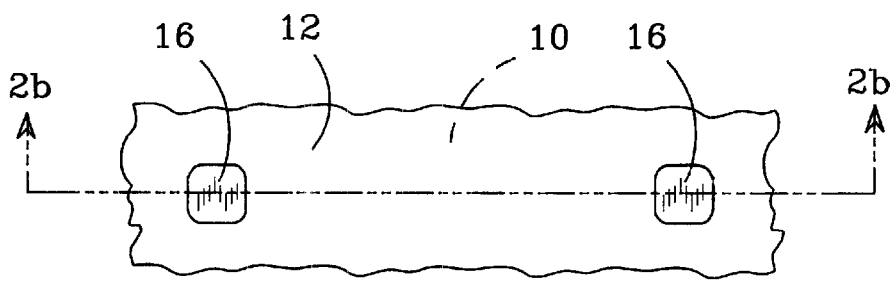
Figure 2B:
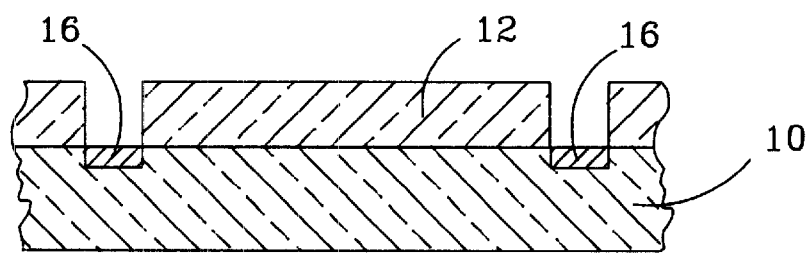

A silicide metallization step is performed next. As shown in FIGS. 2a and 2b, a conductive material layer, typically metal, is deposited, sintered, and stripped to metallize the open contact areas. The metal, preferably platinum (Pt), is preferably deposited by being sputtered onto the wafer. The metal is then sintered, preferably by annealing the Pt at approximately 500° C. for about 30 minutes in a dry nitrogen ($N_2$) atmosphere. During the anneal, Pt that comes in contact with substrate 10 reacts with it to form platinum silicide ($PtSi_2$) (assuming a silicon substrate); the resultant $PtSi_2$ "wells" 16 reduce contact resistance. After anneal, unreacted Pt is stripped, preferably using a mixture containing HCl and $HNO_3$, leaving metal at the bottom of contact areas 14. Though $PtSi_2$ is the most commonly used silicide in contact areas, other silicides could be used as well.

Figure 3A:
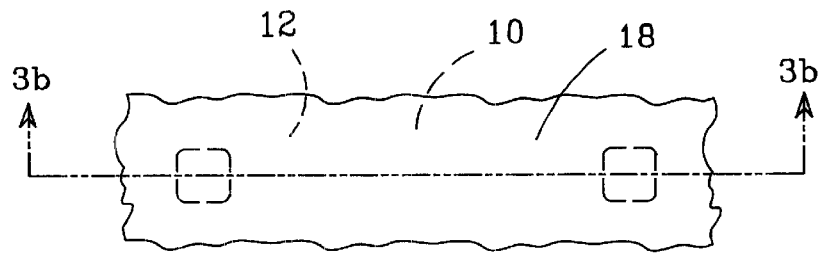
Figure 3B:
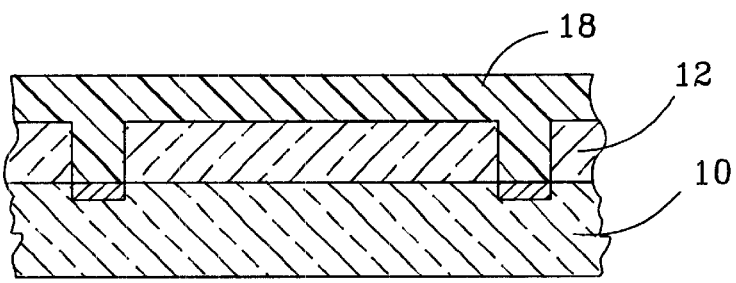

In FIGS. 3a and 3b, a TF material layer 18, preferably silicon chromium carbide (SiCrC) or silicon-chromium (SiCr), is deposited on the oxide layer, preferably by sputtering. These TF materials are widely used to fabricate TF resistors.

Figure 4:
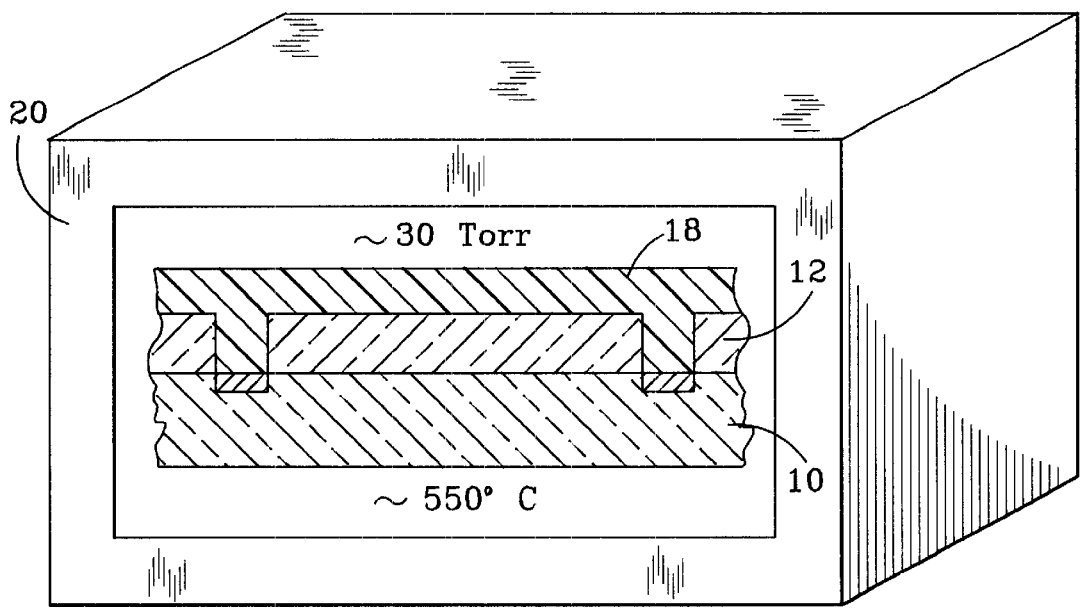

A rapid thermal annealing (RTA) step is performed next, to anneal and stabilize the TF material; this is depicted in FIG. 4. When the TF material is SiCrC or SiCr, RTA is carried out at a temperature of about 550° C. (±3° C.) for about 1 minute. The RTA is preferably carried out at a reduced pressure of about 30 Torr (±5 Torr), with pressure in the chamber preferably regulated with nitrogen. A reduced pressure is preferred because experimentation has shown that furnace annealing at atmospheric pressure has little to no positive effect on the integrity of the TF material. With the TF material stabilized, subsequent high temperature process steps can be performed without adversely affecting the TF material's resistance, sheet rho, and TCR characteristics.

Figure 5A:
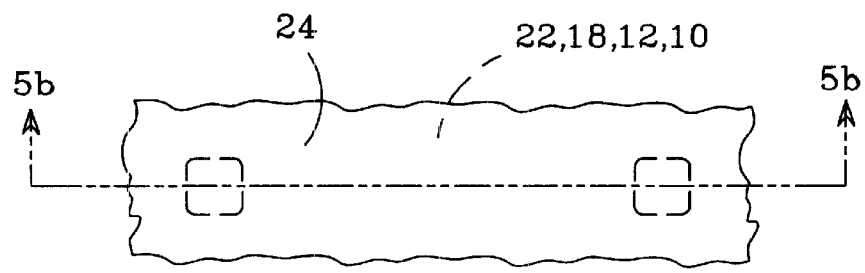
Figure 5B:
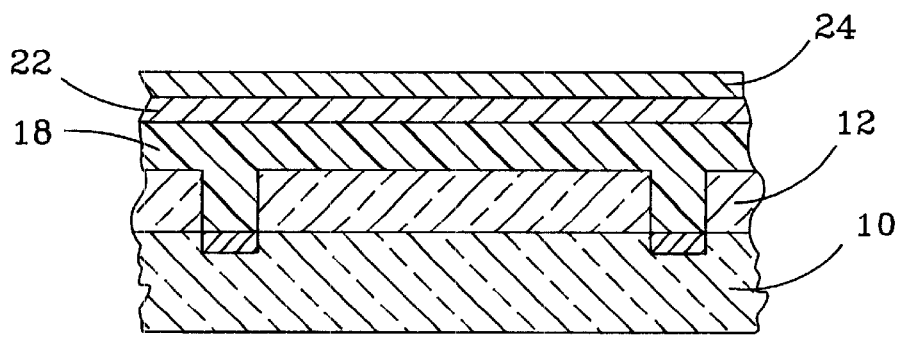

In FIGS. 5a and 5b, a barrier material 22, preferably titanium tungsten (TiW), is deposited on the wafer, preferably by sputtering. The TiW layer, preferably about 900 Å thick, serves several purposes. It helps reduce electromigration and improve current density, and it improves the quality of the contacts to thin film material 18. TiW is the preferred barrier material because it provides a superior thin film resistor noise characteristic; however, other barrier materials could be used as well, or, in some applications, dispensed with altogether.

A metal layer 24, preferably aluminum copper (AlCu), is deposited on barrier material 22, preferably by sputtering. This metal layer is commonly referred to as the "metal 1" (M1) layer. This step is typically performed at a temperature of about 400° C., but because the TF material has been stabilized, this elevated temperature has very little impact on the TF's characteristics.

Figure 6A:
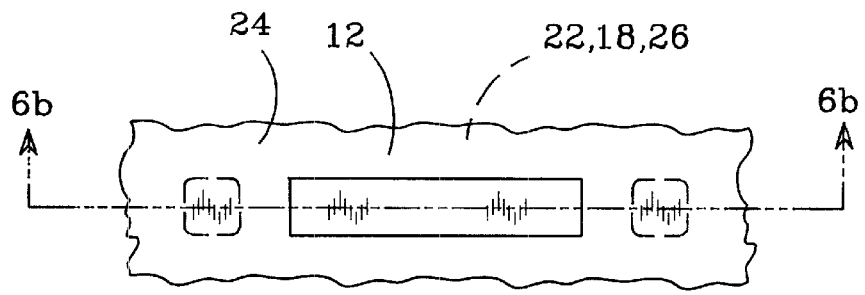
Figure 6B:
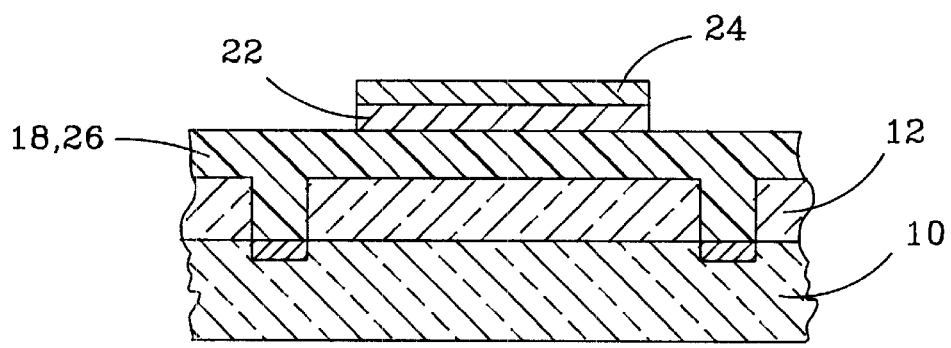

An M1 mask step is performed next, with the results shown in FIGS. 6a and 6b. This step etches the AlCu 24, TiW 22 and TF material 18 according to the M1 mask pattern, to define the M1 layer's metal traces and the boundaries of the TF structures, such as a TF resistor 26, for example.

Figure 7A:
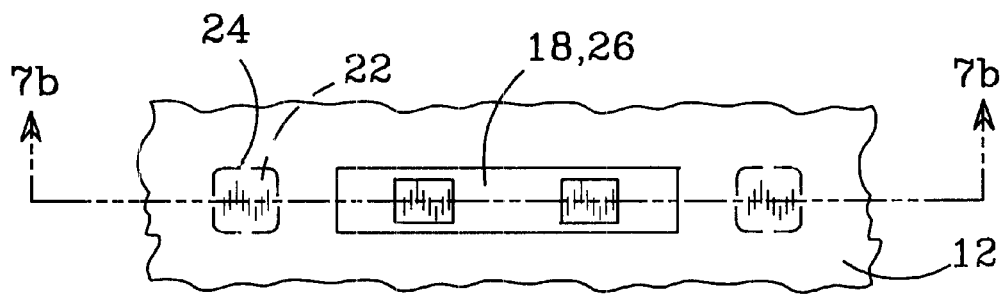
Figure 7B:
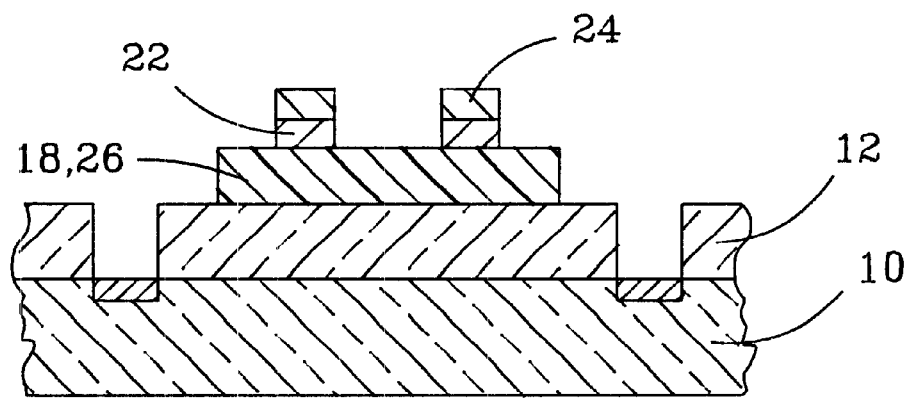

A Thin Film Open Mask (TFOM) step is then performed, as shown in FIGS. 7a and 7b. The AlCu 24 and TiW 22 over the resistors 18 is etched all the way down to the resistor's surface, except for that needed to provide contacts to the resistor. The TF structures are now completely defined.

Well-known photolithographic techniques, typically involving the etching away of materials not protected by a mask, are used to define the thin film features, as well as for the contact openings and metallization steps; such photolithographic techniques are discussed, for example, in Hamilton & Howard, *Basic Integrated Circuit Engineering*, McGraw-Hill, Inc. (1975), pp. 8–12. Rapid thermal annealing is a well-known fabrication technique discussed, for example, in S. M. Sze, *VLSI Technology*, McGraw-Hill, Inc. (1988), pp. 359–362.

Additional process steps are performed as necessary to complete the fabrication of a given I.C. For example, the following steps can be performed after the TFOM step to provide a second metal layer (M2) and to complete the process:

1. PECVD Oxide Deposition I. A phosphorous-doped PECVD oxide is deposited, typically at a temperature of about 400° C.
2. Spin-On Glass (SOG) Coat/Cure and Etch Back. An inorganic material is spun onto the substrate to planarize the PECVD oxide, and then treated at 400–450° C. to form inorganic oxide. The wafer is plasma etched with a 1:1 ratio to smooth the edges of the PECVD oxide covering the M1 layer.
3. PECVD Oxide Deposition II. A second layer of PECVD oxide is deposited on the substrate to thicken the interlayer dielectric provided by PECVD Oxide Deposition I and the SOG coat/cure steps; typically performed at a temperature of about 400° C.
4. Via Mask. A via mask step opens holes in the oxide where metal is to make contact with M1.
5. Sputter AlCu. This step creates an M2 layer. Typically performed at about 400° C.
6. Metal 2 Mask. This step dry etches the AlCu according to the M2 mask pattern.
7. Oxide/Oxynitride PECVD. Passivation is performed using 2 layers: an undoped PECVD oxide layer followed by an oxynitride layer. Typically performed at about 400° C.
8. Seal Mask Oxynitride-oxide etch. The passivation layer is plasma etched in accordance with the seal mask to opens holes to the M2 bond pads 9. Alloy. This step sinters and further stabiles the TF material.

Previously, it had been necessary to perform the alloying step at about 465° C. in order to stabilize the TF. However, with the TF material already stabilized via the RTA performed immediately after the TF's deposition, the temperature at which the alloying step is performed is reduced to about 400° C. When performed at the higher temperature, the alloying step can have an adverse effect on device reliability. The lower alloy temperature made possible by the novel method thus improves device reliability.

Stabilizing the TF material via RTA immediately after TF sputter serves to greatly reduce the negative impact of subsequent high temperature processing steps, improving the integrity of the TF. Once stabilized, the TF material's sheet resistance shows little deviation as the device is processed through the high temperature steps. Thus, the accuracy of TF resistors made in this way is higher, and the ability to match resistors is improved. In addition, TF resistors per the present invention demonstrate highly consistent resistor TCR and sheet rho, both within a given wafer and from wafer to wafer.

The metallization and thin film resistor shown in FIGS. 1–7 are merely illustrative; the traces and TF structures can be arranged in an infinite number of ways. Essential to the novel method, however, is that the thin film material sputtered onto the wafer be rapid thermal annealed and stabilized before any additional processing steps are performed.

The new process described herein does not require any additional design rules or complex processing steps. As such, it can be easily adapted to the fabrication of existing products that currently use the prior art method, with little impact on fabrication cost or time.

Though the present process has described the fabrication and stabilization of thin film features on a silicon substrate, the process is useful with other substrate materials as well, including, for example, polysilicon or gallium arsenide. In addition, although the fabrication of a thin film resistor was described and shown, the process sequence described herein is also applicable to the fabrication of other thin film components, including, for example, thin film capacitors and transistors.

While particular embodiments of the invention have been shown and described, numerous variations and alternate embodiments will occur to those skilled in the art. Accordingly, it is intended that the invention be limited only in terms of the appended claims.

I claim:

1. A method of stabilizing thin film structures on an integrated circuit (I.C.) substrate, comprising the steps of:
   sputtering a thin film material onto an I.C. substrate, said thin film material selected from a group consisting of silicon-chromium (SiCr) and silicon chromium carbide (SiCrC),
   annealing the thin film material via rapid thermal annealing (RTA) in a nitrogen atmosphere at a pressure of about 25–35 Torr such that said thin film material's sheet rho and temperature coefficient of resistance (TCR) are substantially unchanged by said RTA step, said RTA stabilizing said thin film material and thereby enabling the integrity, sheet rho and TCR of said material to be maintained when subjected to subsequent high temperature process steps, and
   masking and etching said annealed thin film material to define individual thin film structures.

2. The method of claim 1, wherein said thin film structures are thin film resistors.

3. The method of claim 1, wherein said RTA is performed at a temperature of about 547–553° C. for about 1 minute.

4. A method of fabricating and stabilizing thin film integrated circuit (I.C.) structures, comprising the steps of:
   sputtering thin film material on an oxide layer formed on an I.C. substrate,
   annealing said thin film material via rapid thermal annealing (RTA) in a nitrogen atmosphere at a pressure of about 25–35 Torr such that said thin film material's sheet rho and temperature coefficient of resistance (TCR) are substantially unchanged by said RTA step, said RTA stabilizing said thin film material and thereby enabling the integrity, sheet rho and TCR of said material to be maintained when subjected to subsequent high temperature process steps,
   sputtering a layer of metal onto said thin film material,
   masking and etching said layer of metal and said thin film material to define desired thin film structures on said wafer, and
   masking and etching said thin film structures to remove additional metal from selected portions of the thin film structures' surfaces.

5. The method of claim 4, wherein said thin film material is selected from a group consisting of silicon-chromium (SiCr) and silicon chromium carbide (SiCrC).

6. The method of claim 5, wherein said thin film structures are thin film resistors.

7. The method of claim 5, wherein said RTA is performed at a temperature of about 547–553° C. for about 1 minute.

8. The method of claim 5, wherein said layer of metal is aluminum copper (AlCu).

9. The method of claim 5, further comprising the step of sputtering a barrier material onto said thin film material prior to sputtering said layer of metal.

10. The method of claim 9, wherein said barrier material is titanium tungsten (TiW).

11. The method of claim 5, further comprising the step of alloying said substrate supporting said thin film structures to sinter and stabilize said thin film structures, said alloying step performed at a lower temperature than would be necessary if said RTA step were not performed due to the stabilizing of said thin film material provided by said RTA step.

12. A method of fabricating and stabilizing thin film integrated circuit (I.C.) structures, comprising the steps of:
   sputtering thin film material on an oxide layer formed on an I.C. substrate, said thin film material selected from a group consisting of silicon-chromium (SiCr) and silicon chromium carbide (SiCrC),
   annealing said thin film material via rapid thermal annealing (RTA) in a nitrogen atmosphere at a pressure of about 25–35 Torr, said. RTA stabilizing said thin film material and thereby enabling the integrity of said material to be maintained when subjected to subsequent high temperature process steps,
   sputtering a layer of metal onto said thin film material,
   masking and etching said layer of metal and said thin film material to define desired thin film structures on said wafer, and
   masking and etching said thin film structures to remove additional metal from selected portions of the thin film structures' surfaces,
   alloying said substrate supporting said thin film structures to sinter and stabilize said thin film structures, said alloying step performed at at about 400° C.

* * * * *